US010230380B2

(12) United States Patent
Pake Talei

(10) Patent No.: US 10,230,380 B2
(45) Date of Patent: Mar. 12, 2019

(54) PHASE-LOCKED LOOP

(71) Applicant: Infineon Technologies AG, Neubiberg (DE)

(72) Inventor: Arash Pake Talei, Villach (AT)

(73) Assignee: Infineon Technologies AG, Neubiberg (DE)

( * ) Notice: Subject to any disclaimer, the term of this patent is extended or adjusted under 35 U.S.C. 154(b) by 4 days.

(21) Appl. No.: 15/634,894

(22) Filed: Jun. 27, 2017

(65) Prior Publication Data

US 2018/0062662 A1 Mar. 1, 2018

(30) Foreign Application Priority Data

Aug. 23, 2016 (DE) .......................... 10 2016 115 657

(51) Int. Cl.
*H03L 7/08* (2006.01)
*H03L 7/093* (2006.01)
*H03L 7/099* (2006.01)

(52) U.S. Cl.
CPC ............ *H03L 7/093* (2013.01); *H03L 7/0991* (2013.01); *H03L 2207/50* (2013.01)

(58) Field of Classification Search
None
See application file for complete search history.

(56) References Cited

U.S. PATENT DOCUMENTS 9,712,174 B1 * 7/2017 Amaral ..................... H03L 1/00

OTHER PUBLICATIONS

Dalt, et al., "An All-Digital PLL Using Random Modulation for SSC Generation in 65nm CMOS," ISSCC 2013, Session 14, Digital PLLs and Building Blocks, 14.3, Feb. 19, 2013, 4 pp.
Chow, "Jitter's faces: Random, periodic, and ISI,": Oct. 30, 2013, retrieved from http://www.edn.com/design/test-and-measurement/4423552/See-jitter-s-faces--Random—periodic—and-ISI, 1 pp.
Razavi, "Design of Analog CMOS Integrated Circuits," Los Angeles; McGraw-Hill; Jan. 2003, Chapter 15, pp. 532-578.
"Integrated Phase Noise," Silicon Labs, Dec. 4, 2011, 8 pp.
Chandhoke, "Basics of Clock Jitter," ON Semiconductor, Apr. 2010, 5 pp.
"Cross-correlation," Wikipedia, accessed on Jun. 28, 2017, accessed from https://en.wikipedia.org/wiki/Cross-correlation, 6 pp.
"How to Overcome EMI Problems by Using Clock Generators Equipped with Spread-Spectrum Clocking (SSC)," Texas Instruments, Aug. 31, 2010, 30 pp.
"Phase-locked loop," Wikipedia, accessed on Jun. 28, 2017, accessed from https://en.wikipedia.org/wiki/Phase-locked_loop, 15 pp.
"Ring oscillator," Wikipedia, accessed on Jun. 28, 2017, accessed from https://en.wikipedia.org/wiki/Ring_oscillator, 3 pp.
"Spread-Spectrum Clocking," National Instruments, Nov. 2, 2009, 2 pp.

* cited by examiner

*Primary Examiner* — Cassandra Cox
(74) *Attorney, Agent, or Firm* — Shumaker & Sieffert, P.A.

(57) ABSTRACT

Phase-locked loop devices are provided where a correction factor is determined based on a correlation using a linear controller.

20 Claims, 7 Drawing Sheets

PHASE-LOCKED LOOP

TECHNICAL FIELD

The present application relates to phase-locked loops and to associated methods.

BACKGROUND

A phase-locked loop (PLL) is an electronic circuit which uses a feedback path to generate an output signal wherein a phase and in many cases also a frequency of the output signal is "locked" to a reference signal. In particular, by using frequency dividers in a feedback path, a PLL may be used to generate an output signal having a frequency which is a multiple of a reference frequency. This may for example be used in communication circuits or other electronic devices to generate a clock signal having a comparatively high frequency based on a reference signal like a crystal oscillator signal having a comparatively low frequency.

Various types of PLLs are used, for example analog PLLs, digital PLL with a digital phase detector or all digital PLLs where phase detector, filter and oscillator are digital components.

One of the main parts of such a digital PLL is a digitally controlled oscillator (DCO), sometimes also referred to as numerically controlled oscillator (NCO). A DCO converts a digital signal supplied thereto as a control signal to an output signal having a frequency determined by the control signal and a gain factor Kdco of the DCO. This gain factor is in many implementations significantly dependent on processor, voltage and temperature variations, commonly abbreviated PVT. High frequency PLLs (for example operating at frequencies in the Megahertz or Gigahertz range) produce electromagnetic fields which may cause problems by interfering with electronic devices or circuits close to the PLL. This phenomenon is referred to as electromagnetic interference, EMI. To reduce or avoid such electromagnetic interference, a peak output power of an output signal of the PLL is required to be below a certain predetermined limit. To achieve this, the output frequency of the PLL in some implementations is modulated, for example with a random sequence, thus broadening the output spectrum while reducing peak power. Such approaches are for example known under the term "spread spectrum clocking" (SSC). Such approaches reduce electromagnetic interference, but also increases a timing error or jitter of the signal generated by the PLL. If the jitter gets to large, e.g. in communication circuits this may lead for example to communication errors. Therefore, jitter needs to be below a certain limit. As explained above, the gain factor Kdco depends on PVT, which may lead to comparatively large jitter. Consequently, it is desirable to at least partially compensate the effects of PVT on digital PLL to reduce jitter.

One approach to compensate at least process variations is to measure a deviation caused by process variations during a production test and to store a compensation value in a register, which is then used to compensate the process variations. One drawback of this approach is that all the chips comprising such a PLL need to undergo this process, which consumes time during production test. Another disadvantage is that only process variations may be compensated, while temperature or voltage variations occurring during actual use are not compensated.

Another conventional approach is to measure a cross correlation between a random sequence and an output of a phase detector of the PLL, and use an on-off controller for compensation. An on-off controller increments or decrements a correction value in discrete steps depending on the above-mentioned correlation and one or more thresholds. In such an approach, instabilities of the controller may occur, and the controller needs a comparatively large chip area.

Further approaches using a correlation are disclosed in Nicola Da Dalt et al., "An All-Digital PLL Using Random Modulation for SSC Generation in 65 nm CMOS", ISSCC 2013, IEEE International Solid-State Circuits Conference (Conference Proceedings), pages 252 ff.

It is an object to provide phase-locked loops where PVT variations may at least partially be compensated and which exhibit increased stability compared to conventional solutions.

SUMMARY

A device as defined in claim 1 or 16 and a method as defined in claim 12 are provided. The dependent claims define further embodiments.

According to an aspect, a device is provided, comprising:
a phase-locked loop comprising a phase detector, a loop filter coupled to an output of the phase detector and a controllable oscillator., a control input of the controllable oscillator being coupled to an output of the loop filter,
a random sequence generation circuit configured to generate a random sequence,
a correlation circuit configured to form a correlation between the random sequence and an output signal of the phase detector,
a linear controller circuit configured to generate a correction factor for the random sequence based on the correlation, wherein the device is configured to modify a signal at the control input of the digitally controlled oscillator based on the correlation modified based on the correction factor.

According to another aspect, a method is provided, comprising:
correlating a phase difference in a phase-locked loop with a random sequence to form a correlation,
filtering the correlation,
determining a gain correction factor based on the filtered correlation by a linear controller, and
controlling a controllable oscillator based on the gain correction factor and the phase difference.

According to another aspect, a device is provided, comprising:
a digital phase-locked loop, the digital phase-locked loop comprising a digital phase detector, a digital loop filter, wherein an input of the digital loop filter is coupled to an output of the digital phase detector and the output of the digital loop filter is coupled to a first input of an adder, and a digitally controlled oscillator, wherein an output of the control input of the digitally controlled oscillator is coupled to an output of the adder, and wherein an output of the digitally controlled oscillator is coupled to an input of the phase detector,
a random sequence generator circuit,
a multiplier, wherein a first input of the multiplier is coupled to an output of the random sequence generator and wherein a second input of the multiplier is coupled to an output of the phase detector,
a low pass filter, wherein an input of the low pass filter is coupled to an output of the multiplier, a linear controller, wherein an input of the linear controller is coupled to an output of the low pass filter, and an output of the linear controller determines a correction factor, a further multiplier, the further multiplier being coupled to an output of the random sequence generator circuit to multiply an output of the random sequence generator circuit with the correction factor, wherein an output of the further multiplier is coupled to a second input of the adder.

The above summary is merely intended to give a brief overview of some features of some embodiments and is not to be construed as limiting. In particular, other embodiments may use other features, elements or components than the ones discussed above.

DETAILED DESCRIPTION

Figure 1:
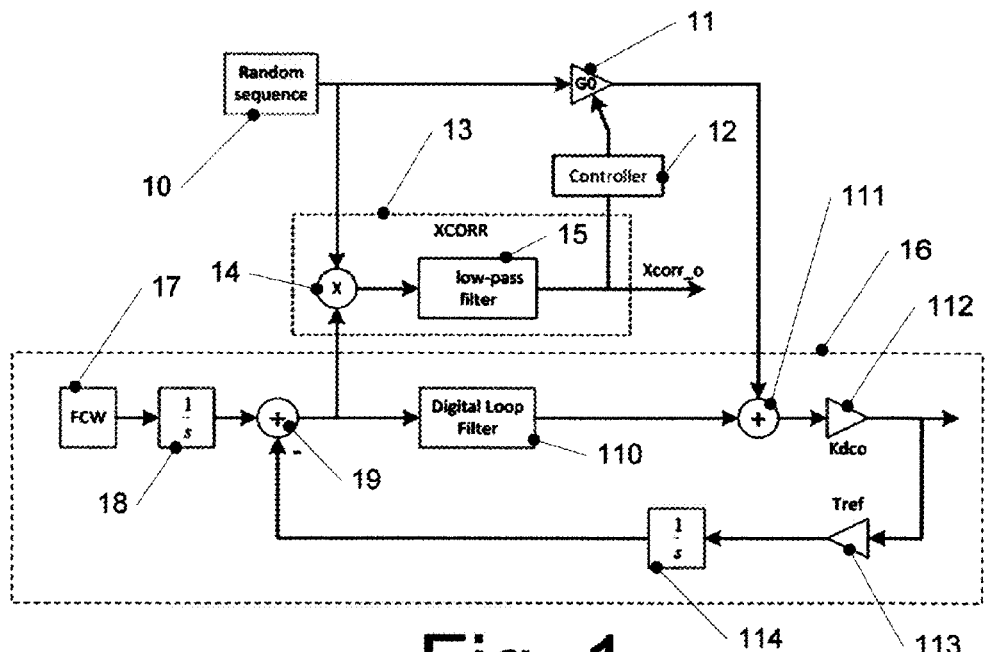
FIG. 1 is a block diagram of a device according to an embodiment.

In the following, various embodiments will be described in detail referring to the attached drawings. These embodiments are given by way of example only and are not to be construed as limiting. While embodiments may be described comprising a plurality of features or elements, this does not indicate that all these features or elements are necessary for implementation. Instead, in other embodiments some of these features or elements may be omitted and/or may be replaced by alternative features or elements. In addition to the features or elements explicitly shown and described, other features or elements may be provided, for example features or elements used in conventional phase-locked loop (PLL) circuits, devices and methods.

In the embodiments shown in the drawings or described herein, any direct connection or coupling between functional blocks or elements may also, i.e. a connection or coupling comprising no intervening elements, may also be replaced by an indirect connection or coupling, i.e. a connection or coupling comprising one or more additional intervening elements, as long as the general purpose and function of the connection or coupling, for example to transmit a certain kind of signal, to transmit a certain kind of information or to provide a certain kind of control, is essentially maintained.

Variations and modifications described with respect to one of the embodiments may also be applied to other embodiments.

The term "random sequence" as used herein is also intended to encompass a pseudorandom sequence or any other sequence which essentially has the properties of a random sequence, in particular with respect to application for spread spectrum clocking (SSC).

A linear controller, as used herein, is a controller which is implemented as a linear system, i.e. when H is an operation that maps an input $x(t)$ as a function of time t provided to the linear controller to an output $y(t)$ of the controller, $\alpha y_1(t) + \beta y_2(t) = H\{\alpha x_1(t) + \beta x_2(t)\}$ applies for $y_1(t) = H\{x_1(t)\}$, $y_2 = H\{x_2(t)\}$ and $\alpha$, $\beta$ being scalar values. It should be noted that in a digital implementation of a linear controller as used in embodiments discussed herein, such a linear behavior is present within a certain operating range, while saturation occurs outside the operating range. This is because with a finite number of bits, a finite range of values may be represented, and saturation occurs outside this range. For example, if a controller has an 11-bit output (including a sign bit), output values may have a range from −1023 to +1024, saturating outside this range. Furthermore, with digital linear controllers the linearity is limited by the quantization, i.e. is accurate only within e.g. one least significant bit (LSB). Nevertheless, also such digital linear controllers are to be regarded as linear controllers as used herein.

A behavior of such a linear controller can be predicted. If it is calculated to be stable (mathematically) during a design phase, there is a very high chance that it is also stable in a real implementation. With non-linear controllers, this is more difficult. Further, linear controllers tend to require less chip area than non-linear controllers.

Turning now to the figures, FIG. 1 shows a phase-locked loop circuit according to an embodiment. The device of FIG. 1 comprises a phase-locked loop (PLL) generally designated 16 and additional components 10-15 to reduce electromagnetic interference (EMI) and/or jitter.

PLL 16 comprises a subtractor 19 which acts as a phase detector to output a phase difference between a signal derived from an output of a digitally controlled oscillator (DCO) 112 having a gain Kdco and a reference signal. The reference signal is provided as a frequency control word (17). An integrator 18 may serve to accumulate frequency control word 17.

A feedback path of the PLL comprises a multiplier 113 for multiplying with a reference value Tref and an integrator 114. Integrator 114 accumulates a feedback value. Multiplier 113 is representative of a gain occurring when the clock signal output by DCO 112 is provided as a digital value. It should be noted that this need not be provided as a specific component or element, but in embodiments represents a gain that occurs when designing the PLL. This gain in embodiments may help to keep the device stable when a sampling frequency of a controller used (described below) changes.

An output of subtractor 19 is fed to a digital loop filter 110, which essentially may have a low pass filtering function. An output of digital loop filter 110 controls DCO 112.

What is described so far is an implementation example of a conventional digital PLL. Other conventional digital PLL implementations may also be used.

In addition to this conventional design, PLL 16 comprises an adder 111 adding a random sequence multiplied by a gain correction factor G0 in a multiplier 11 to the output signal of digital loop filter 110. The random sequence is generated by a random sequence generator circuit 10 in any conventional manner, for example any conventional manner for generating pseudorandom sequences.

To adjust the value G0, in a circuit part generally designated 13 a correlation value Xcorr_o is generated. As indicated in FIG. 1, Xcorr_o may be output for test purposes in some implementations. Circuit part 13 comprises a multiplier 14 providing a cross correlation between the random sequence output by random sequence generator circuit 10 and an output signal of subtractor 19, i.e. the phase difference. This correlation is filtered by low pass filter 15 which essentially provides averaging. In some embodiments, low pass filter 15 may be an infinitive impulse response (IIR) filter.

Signal Xcorr_o is provided to a linear controller 12 which controls multiplier 11 to adjust G0. In particular, controller 12 may directly output G0, or may output a value directly correlated to G0, for example a value proportional to G0, with a proportionality factor being additionally applied in multiplier 11.

The control provided by linear controller 12 in embodiments is such that the product of G0 and Kdco essentially is constant. In this way, jitter generated by PVT variations may be reduced or even avoided, and by applying the random sequence (multiplied by G0) to adder 111 EMI requirements may be observed in some embodiments.

Figure 2:
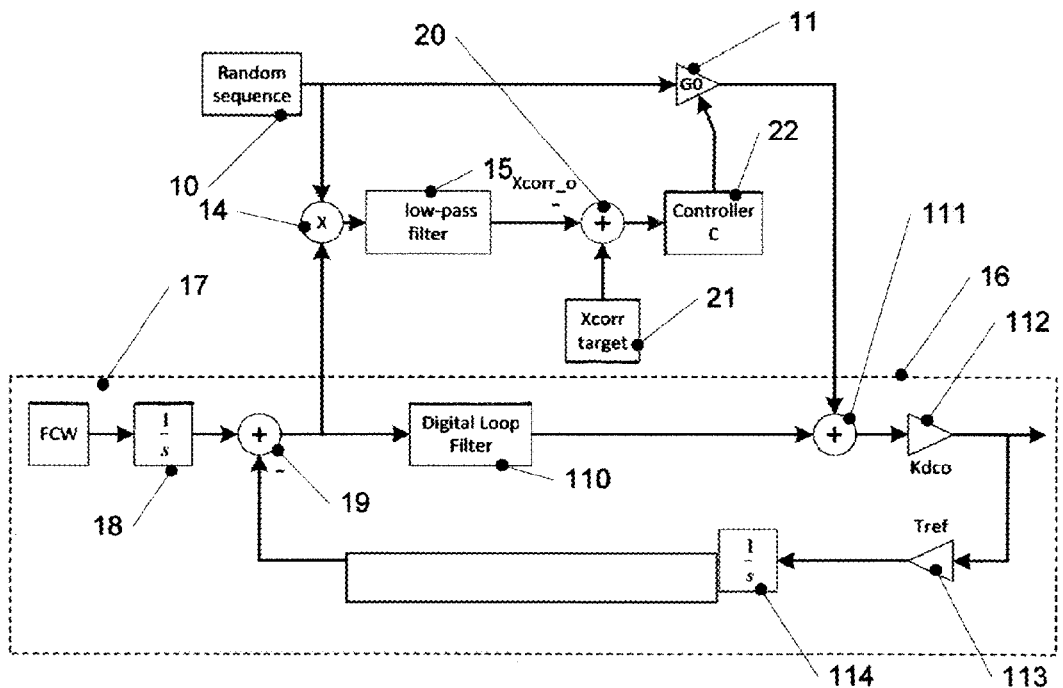
FIG. 2 is a block diagram of a device according to an embodiment.

FIG. 2 shows a PLL circuit according to a further embodiment, where an example determining or adjusting G0 is illustrated in some more detail. Elements and components already discussed with reference to FIG. 1 bear the same reference numerals and will not be discussed again. In particular, also in FIG. 2, PLL 16, random sequence generator 10, multiplier 14 and low pass filter 15 are provided, wherein low pass filter 15 again may be an IIR filter in some embodiments.

In the embodiment of FIG. 2, the value Xcorr_o is provided to a negative input of a subtractor 20. A target value for Xcorr, i.e. for the correlation, is provided to a positive input of subtractor 20 from a storage 21 (e.g. a register), and an output of subtractor 20 representing a difference between the target value and the actual value Xcorr_o is provided to a linear controller 22. The target value may be set at a factory and may for example be based on simulations or measurements. Linear controller 22 then sets G0 depending on the output of subtractor 20. Controller 22 may for example perform linear operations on the output of subtractor 20 to set the value G0.

Next, referring to FIGS. 3-6, implementation examples for various parts of the circuit of FIGS. 1 and 2 suitable for integration based VHDL or similar implementations are illustrated. These implementations examples serve merely to provide a more detailed understanding and are not to be construed as limiting. The implementation examples are provided in so-called bit true format, where a bit width of each coupling is considered during implementation.

Figure 3:
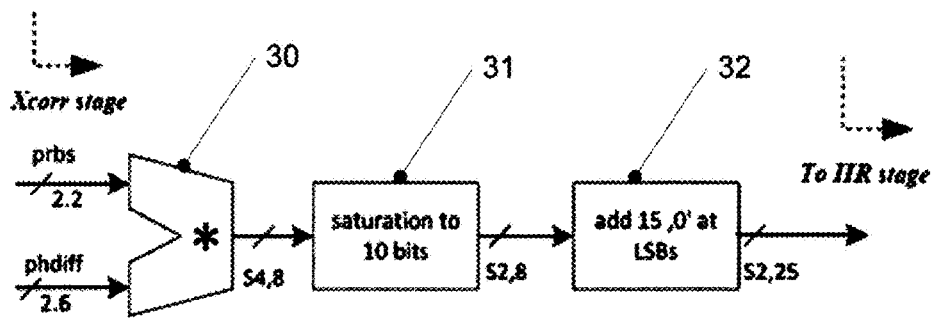
FIGS. 3-6 illustrate implementation examples of various portions of the embodiments of FIGS. 1 and 2, FIGS. 7 and 8 show examples of infinite impulse response filters usable in some embodiments.

FIG. 3 illustrates an implementation example of multiplier 14 of FIGS. 1 and 2 providing the correlation. The implementation example of FIG. 3 receives a pseudorandom binary sequence prbs from a random sequence generator and a phase difference value phdif, which may have different bit widths. A multiplier 30 performs the actual correlation. At 31, the resulting value is saturated to 10 bits (i.e. the output is a 10 bit value), and at 32, 15 zeros are added at least significant bits to provide a 25 bit value. This value is then provided to an infinite impulse response filter, for which an implementation example is illustrated in FIG. 4.

Figure 4:
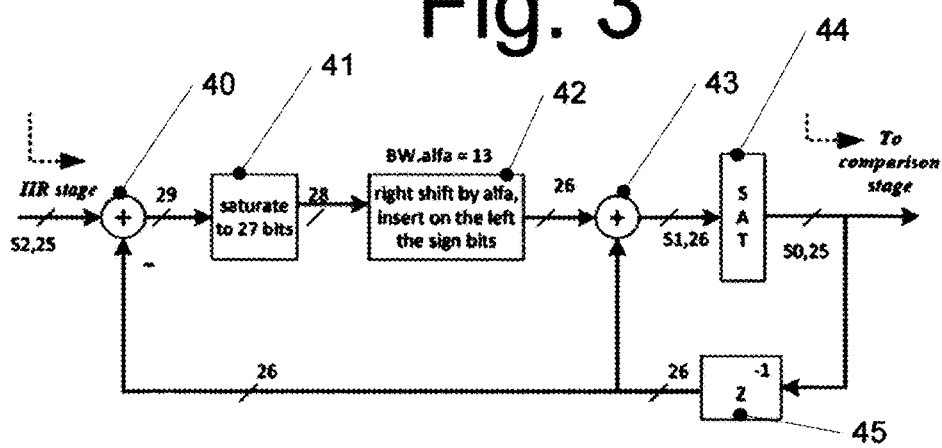

In FIG. 4, the digital signal output by the correlation stage illustrated in FIG. 3 is provided to a positive input of an adder 40. An output of adder 40 is saturated to 27 bits at 41 and right-shifted by a value α at 42, for example by 13 bits, although other values are also possible. On the left, sign bits are inserted. "Right" and "left" in this respect refer to a usual representation of digital values, where at least significant bits are written on the right, sign bits on the left followed by the most significant bits. An output of block 42 is provided to an input of an adder 43. An output of adder 43 is provided to a SAT (saturation) block 44, which outputs the result of the filter to a comparison state implementing the functionality of subtractor 20 FIG. 2, which will be described later with respect to FIG. 5. Generally, SAT blocks in FIGS. 4-6 have a limiting function ensuring that a number represented by the output signal of the respective SAT block does not exceed a certain predefined value.

Furthermore, the output of SAT block 44 is fed back to a further input of adder 43 and a negative input of subtractor 40 via a delay 45 delaying the value by one clock period.

Figure 5:
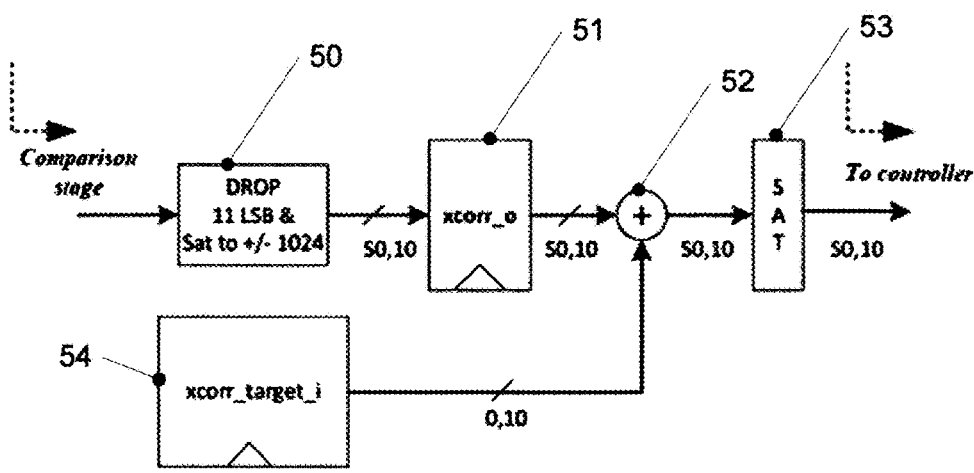
Figure 6:
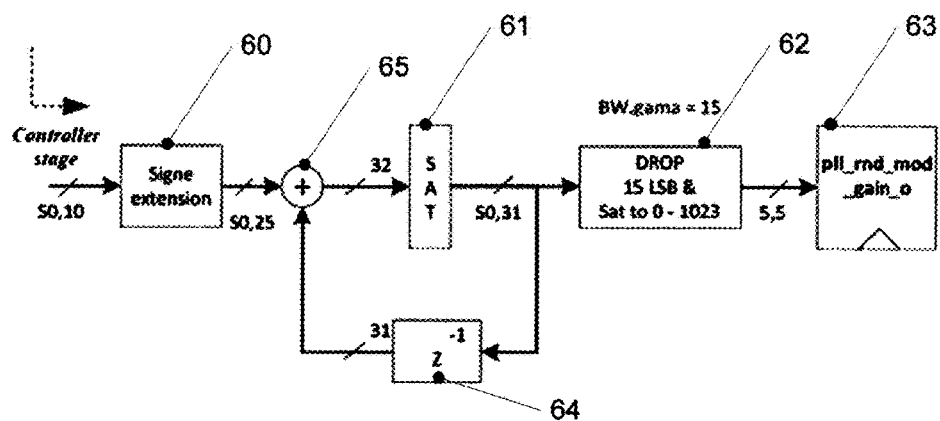

In an implementation of a comparison stage shown in FIG. 5, the value output by the filter of FIG. 4 is provided to a block 50 which drops 11 least significant bits and saturates to +/−1024. The result is stored in a register 51 as Xcorr_o and then added to a target value Xcorr_target_i from a storage 54, which corresponds to the function of subtractor 20 of FIG. 2. An output of adder 52 is provided to a SAT block 53, which then outputs the result to a controller illustrated in FIG. 6. FIG. 6 illustrates an implementation example of linear controller 22 of FIG. 2.

In the implementation example of a controller in FIG. 6, the input signal from FIG. 5 is provided to a sign extension block 60 and then to an adder 65. An output of adder 65 is provided to a SAT block 61. The output of SAT block 61 is fed back via a feedback loop comprising delay 64 by one clock period to a further input of adder 65, thus forming an integrator. Therefore, in the implementation example of FIG. 6, the controller is an I (integral) controller. Other types of linear controllers like P (proportional), PI (proportional-integral) or PID (proportional-integral-derivative) controllers may also be used. Furthermore, the output of SAT block 61 is provided to a block 62 where 15 at least significant bits are dropped and the result is saturated to 0-1023. Depending on the implementation, also a different number of least significant may be dropped as indicated by a parameter BW.Gama. The output is then provided to a register 63 as value G0 or a value indicative thereof.

Figure 7:
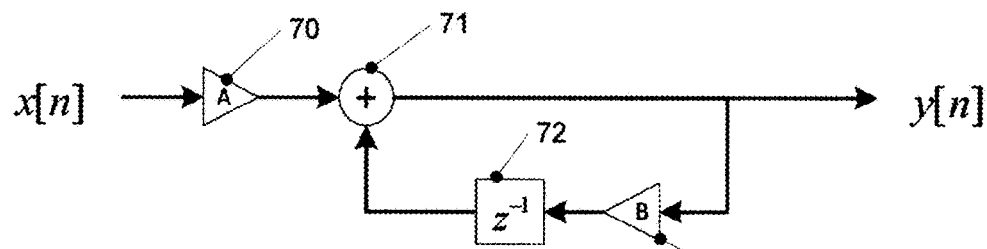
Figure 8:
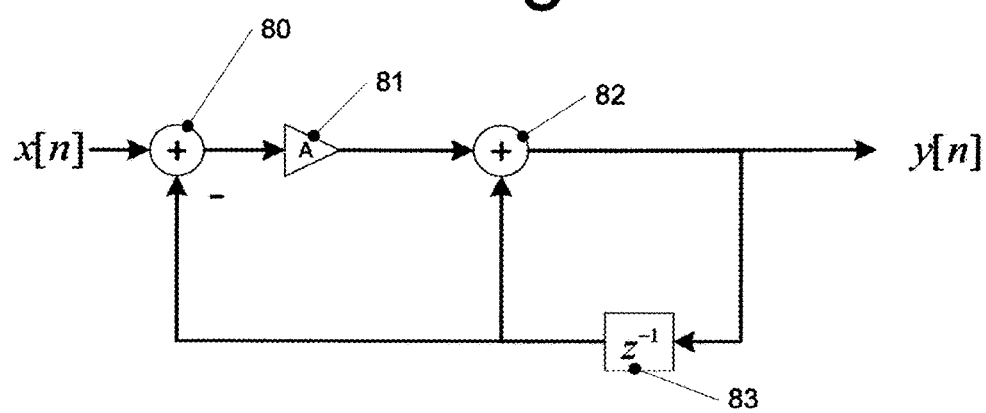

FIGS. 7 and 8 illustrate two implementation possibilities for an infinite impulse response low pass filter, e.g. filter 15 of FIG. 1 or 2, wherein FIG. 8 corresponds essentially to the specific implementation of FIG. 4 and FIG. 7 illustrates an alternative implementation. The example of FIG. 7 illustrates an IIR filter with two coefficients A, B. A digital input sequence x[n] is multiplied by coefficient A at 70 and provided to a first input of an adder 71. An output of adder 71 outputs an output sequence y[n]. Furthermore, the output of adder 71 is multiplied by coefficient B at 74 and delayed at 72 before being fed to a second input 71.

FIG. 8 illustrates an implementation with a single coefficient A, which corresponds to the right shifting at 42 of FIG. 4. In the filter of FIG. 8, an input sequence x[n] is provided to a positive input of a subtractor 80. An output of subtractor 80 is multiplied by coefficient A at 81 and provided to a first input of an adder 82. An output of adder 82 corresponds to an output sequence y[n]. Furthermore, the output of adder 82 is delayed at 83 and fed back to a second input of adder 82 and to a negative input of subtractor 80.

Other implementations of IIR filters may also be used.

Figures 9A, 9B, 9C, 9D:
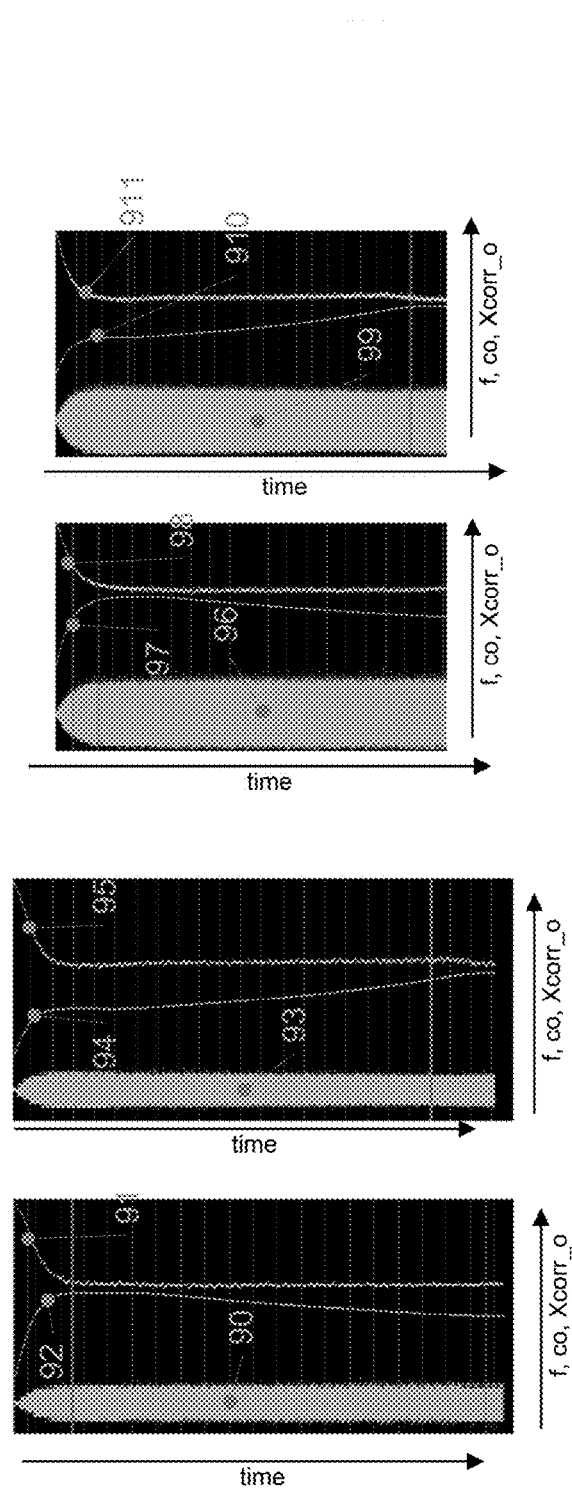
FIGS. 9A-9D, and FIGS. 10-12 show simulation and lab measurement results for illustration purposes.

Next, for further illustration, referring to FIGS. 9-12, simulation results and test results will be discussed. FIGS. 9A-9D illustrate simulation results for different scenarios, in particular different frequencies. In particular, FIGS. 9A and 9B illustrate simulation results for a comparatively lower reference frequency of 16 MHz, and FIGS. 9C and 9D illustrate results for a comparatively higher reference frequency of 40 MHz (for example as determined by frequency control word 17 in FIGS. 1 and 2).

Furthermore, between FIGS. 9A and 9B and between FIGS. 9C and 9D Kdco is varied.

Curves 90, 93, 96 and 99 illustrate the output frequency f of the digitally controlled oscillator over time, where the frequency in the representation of FIGS. 9A-9D plotted in a horizontal direction and time for all curves in the graphs is in a vertical direction. Total simulation time was 45 milliseconds. The variation in frequency in these curves is due to the spread spectrum clocking, i.e. the introduction of the random values.

Curves 92, 94, 97 and 910 represent an output signal co of the linear controller corresponding to or determining G0. Curves 91, 95, 98 and 911 represent the value Xcorr_o.

In all cases, irrespective of the reference value and sweeping direction of Kdco, the controller compensates a drift (which in a real application may for example be caused by voltage or temperature variations) of Kdco.

Figure 10:
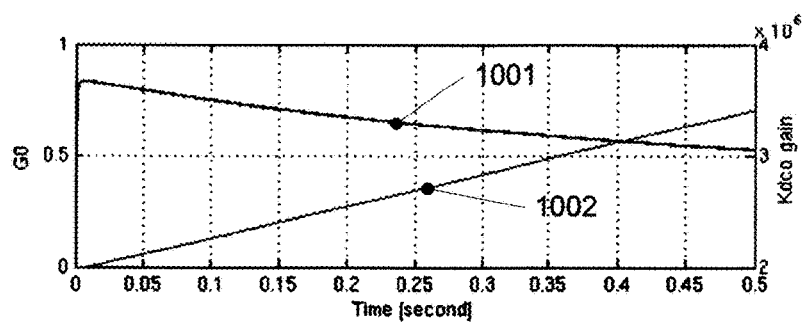
Figure 11:
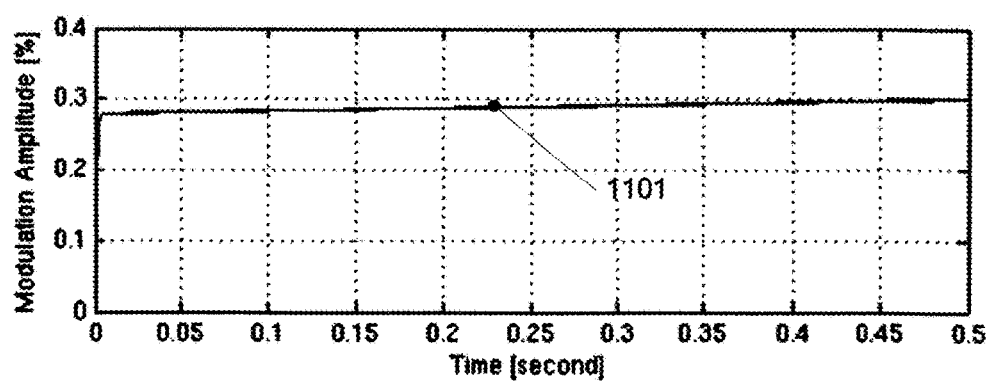

To illustrate this further, FIGS. 10 and 11 illustrate further simulation results. In FIG. 10, a curve 1002 illustrates a drift of Kdco over time starting from about $2 \times 10^6$ to about $3.5 \times 10^6$. A curve 1001 shows the corresponding behavior of G0, which decreases correspondingly. The drift in FIG. 10 is within less than half of a second.

FIG. 11 illustrates the corresponding modulation amplitude of the output frequency of the DCO in percent. As can be seen, a corresponding curve 1101 is almost a flat line, meaning that the product of G0 and Kdco remains almost constant. Therefore, drifts of Kdco for example due to PVT variations may be compensated at least to a great extent.

Figure 12:
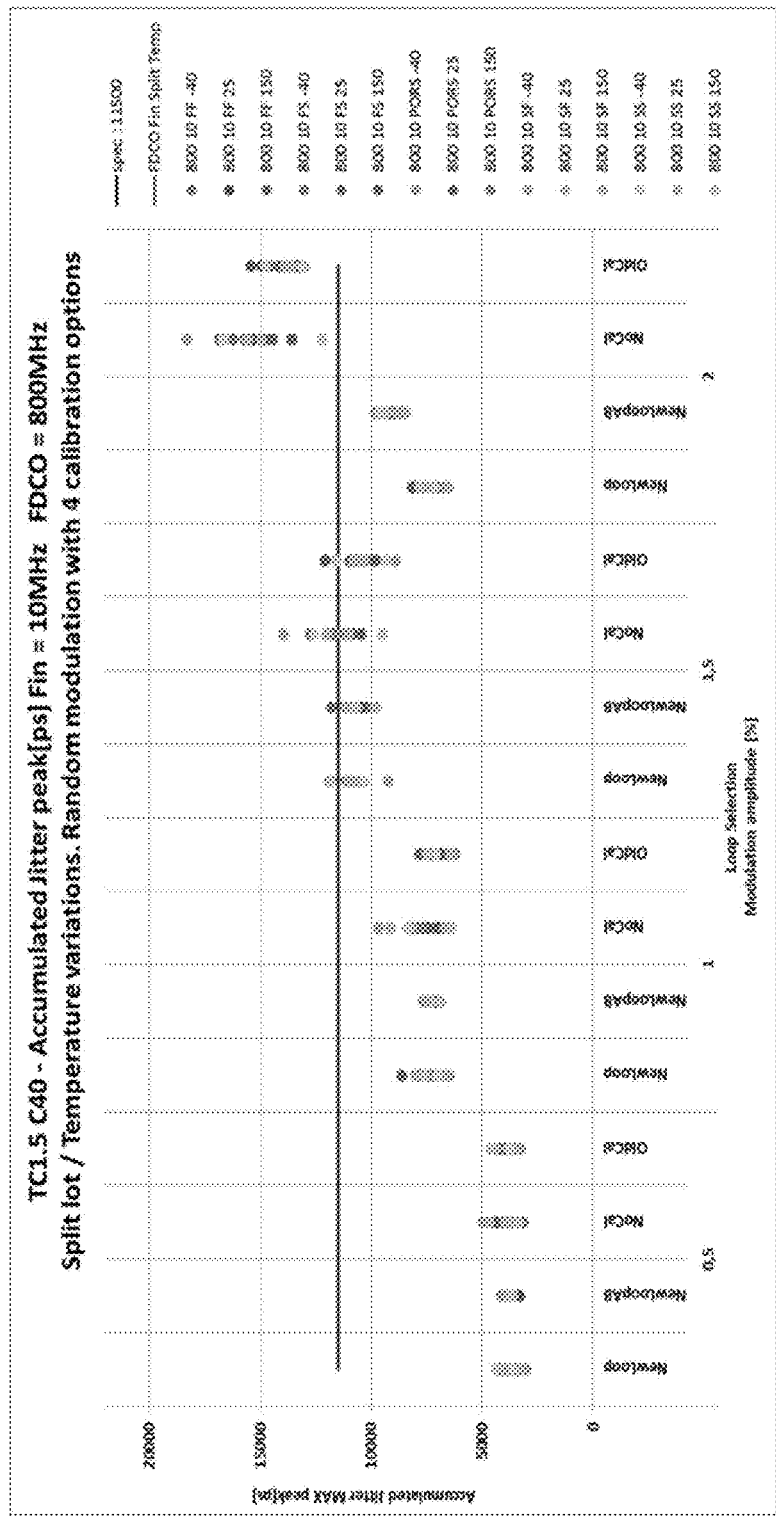

FIG. 12 illustrates accumulated jitter for various situations according to laboratory measurement data for an example implementation. The data is shown for various process corners and temperatures, as shown in the legend on the right of FIG. 12. The results shown are for modulation amplitudes of 0.5, 1, 1.5 and 2 percent. For each modulation amplitude variation, results are shown without a calibration loop (no cal), a conventional calibration loop (old cal), another calibration loop (new loop ab) and a calibration loop implemented according to techniques disclosed herein (new loop). As can be seen, in particular for higher modulation amplitudes the jitter is significantly reduced, and also a variation of jitter with temperature and process variations is reduced.

Figure 13:
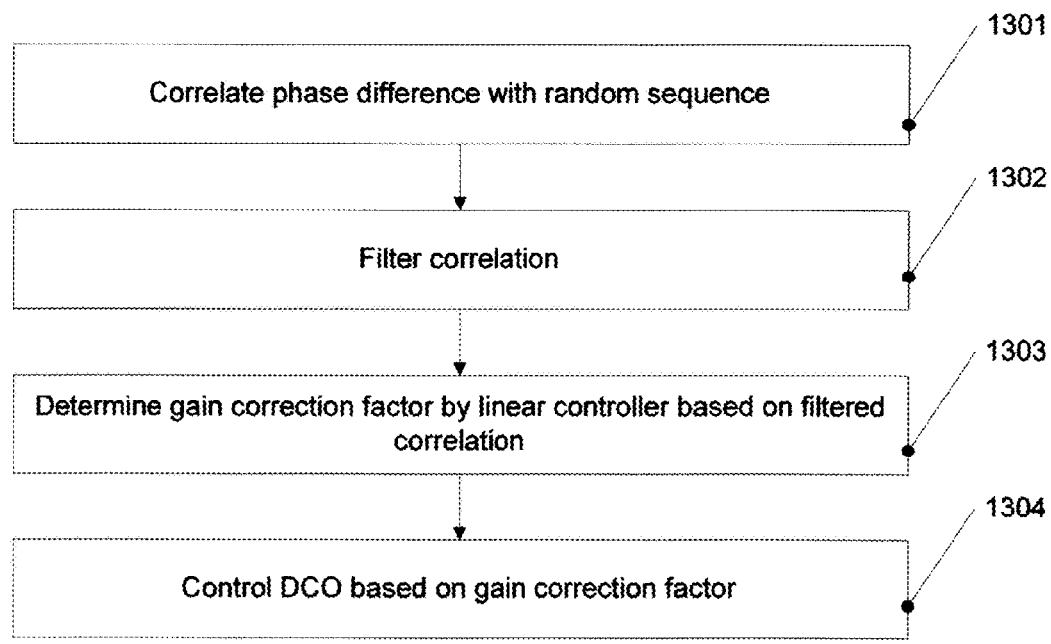
FIG. 13 is a flowchart illustrating a method according to an embodiment.

FIG. 13 illustrates a method according to an embodiment. While the method is shown and described as a series of acts or events, the order in which the acts or events is shown is not to be construed as limiting, and the various actions or events described may for example be performed repeatedly and/or continuously. For ease of illustration, the method of FIG. 13 will be described referring to the devices of FIGS. 1 and 2. However, use of the method of FIG. 13 is not limited to these devices.

At 1301, the method comprises correlating a phase difference determined in a phase-locked loop with a random sequence, for example at multiplier 14 of FIGS. 1 and 2.

At 1302, the method comprises filtering the correlation determined at 1301, for example using a low pass filter like low pass filter 15 of FIGS. 1 and 2.

At 1303, the method comprises determining a gain correction factor, for example G0, by a linear controller like linear controller 12 of FIG. 1 or controller 22 of FIG. 2 based on the filtered correlation.

At 1304, the method comprises controlling a digitally controlled oscillator like oscillator 112 based on the gain correction factor, for example by adding the factor at adder 111 to an output signal of a digital loop filter.

Embodiments using techniques as disclosed herein may have one or more of the following features. Other embodiments may have other features.

The control provided by the linear controller may be stable, simple and completely predictable and reliable. Furthermore, devices according to some embodiments may be easy to analyze with regular linear techniques like body plot, pole zero map etc.

Embodiments may compensate process, temperature and voltage variations. Both slow deviations like slow temperature drifts or process variations and also fast variations like some voltage variations may be possible.

By using a digital controller, embodiments may be immune to analog noise. As in embodiments the compensation occurs when during normal operation of the chip, there is no need for additional calibration during production of the chip. Furthermore, embodiments may require less chip area for implementation than some conventional solutions. Furthermore, configuration in some embodiments may be simple, as for example only one register may be configured (the target value for Xcorr) in some embodiments.

At least some embodiments are defined by the examples given below:

Example 1. A device, comprising:
a phase-locked loop comprising a phase detector, a loop filter coupled to an output of the phase detector and a controllable oscillator, a control input of the controllable oscillator being coupled to an output of the loop filter,
a random sequence generation circuit configured to generate a random sequence,
a correlation circuit configured to form a correlation between the random sequence and an output signal of the phase detector,
a linear controller circuit configured to generate a correction factor for the random sequence based on the correlation, wherein the device is configured to modify a signal at the control input of the digitally controlled oscillator based on the correlation modified based on the correction factor.

Example 2. The device of example 1, further comprising a multiplier configured to multiply the random sequence with the correction factor to generate the modified sequence.

Example 3. The device of example 1, further comprising an adder, wherein a first input of the adder is coupled to an output of the loop filter, wherein a second output of the adder is coupled to receive the modified random sequence, and wherein an output of the adder is coupled to the control input of the oscillator.

Example 4. The device of example 1, wherein the phase-locked loop is a digital phase-locked loop, and wherein the controllable oscillator is a digitally controlled oscillator.

Example 5. The device of example 1, wherein the correlation circuit is a digital circuit.

Example 6. The device of example 1, wherein the linear controller circuit comprises a digital linear controller.

Example 7. The device of example 1, wherein the correlation circuit comprises a multiplier configured to multiply the random sequence with the output signal of the phase generator to generate a multiplied signal, and a low pass filter to filter the multiplied signal to generate the correlation.

Example 8. The device of example 7, wherein the low pass filter is an infinite impulse filter.

Example 9. The device of example 1, further comprising a subtractor coupled to form the difference between the correlation and a correlation target value and to provide the difference to the linear controller circuit.

Example 10. The device of example 1, wherein the correction factor is configured to compensate gain variations of the controllable oscillator.

Example 11. The device of example 1, wherein the digital controller comprises at least one of a proportional controller, an integral controller, a proportional-integral controller or a proportional-integral-derivative controller.

Example 12. A method, comprising:
correlating a phase difference in a phase-locked loop with a random sequence to form a correlation,
filtering the correlation,
determining a gain correction factor based on the filtered correlation by a linear controller, and
controlling a controllable oscillator based on the gain correction factor and the phase difference.

Example 13. The method of example 12, wherein filtering the correlation comprises low pass filtering the correlation.

Example 14. The method of example 12, wherein controlling the controllable oscillator comprises controlling a digitally controlled oscillator.

Example 15. The method of example 12, wherein controlling the controllable oscillator comprises adding the gain correction factor to a signal based on the phase difference to form an added signal, and controlling the controllable oscillator with the added signal.

Example 16. A device, comprising:
a digital phase-locked loop, the digital phase-locked loop comprising a digital phase detector, a digital loop filter, wherein an input of the digital loop filter is coupled to an output of the digital phase detector and the output of the digital loop filter is coupled to a first input of an adder, and a digitally controlled oscillator, wherein an output of the control input of the digitally controlled oscillator is coupled to an output of the adder, and wherein an output of the digitally controlled oscillator is coupled to an input of the phase detector,
a random sequence generator circuit,
a multiplier, wherein a first input of the multiplier is coupled to an output of the random sequence generator and wherein a second input of the multiplier is coupled to an output of the phase detector,
a low pass filter, wherein an input of the low pass filter is coupled to an output of the multiplier,
a linear controller, wherein an input of the linear controller is coupled to an output of the low pass filter, and an output of the linear controller determines a correction factor,
a further multiplier, the further multiplier being coupled to an output of the random sequence generator circuit to multiply an output of the random sequence generator circuit with the correction factor, wherein an output of the further multiplier is coupled to a second input of the adder.

Example 17. The device of example 16, further comprising a subtractor, wherein a first input of the subtractor is coupled to an output of the low pass filter, wherein a second input of the subtractor receives a target value, and wherein an output of the subtractor is coupled to the input of the linear controller.

Example 18. The device of example 16, wherein the low pass filter is an infinite impulse filter.

In view of the modifications and variations discussed above, it is evident that the above embodiments serve only as illustrative examples and are not to be construed as limiting.

The invention claimed is:

1. A device comprising:
a phase-locked loop comprising a phase detector, a loop filter coupled to an output of the phase detector, and a controllable oscillator, a control input of the controllable oscillator being coupled to an output of the loop filter;
a random sequence generation circuit configured to generate a random sequence;
a correlation circuit configured to form a correlation between the random sequence and an output signal of the phase detector;
a linear controller circuit; and
a subtractor configured to output a difference between the correlation and a correlation target value and to provide the difference to the linear controller circuit,
wherein the linear controller circuit is configured to generate a correction factor for the random sequence based on the difference between the correlation and the correlation target value, wherein the device is configured to modify a signal at the control input of the controllable oscillator based on the random sequence modified based on the correction factor.

2. The device of claim 1, further comprising a multiplier configured to multiply the random sequence with the correction factor to generate the modified random sequence.

3. The device of claim 1, further comprising an adder, wherein a first input of the adder is coupled to an output of the loop filter,
wherein a second input of the adder is coupled to receive the modified random sequence, and
wherein an output of the adder is coupled to the control input of the controllable oscillator.

4. The device of claim 1,
wherein the phase-locked loop is a digital phase-locked loop, and
wherein the controllable oscillator is a digitally controlled oscillator.

5. The device of claim 1, wherein the correlation circuit is a digital circuit.

6. The device of claim 1, wherein the linear controller circuit comprises a digital linear controller.

7. The device of claim 1, wherein the correlation circuit comprises:
a multiplier configured to multiply the random sequence with the output signal of the phase detector to generate a multiplied signal, and
a low pass filter to filter the multiplied signal to generate the correlation.

8. The device of claim 7, wherein the low pass filter is an infinite impulse filter.

9. The device of claim 1, wherein the correction factor is configured to compensate gain variations of the controllable oscillator.

10. The device of claim 1, wherein the linear controller circuit comprises at least one of a proportional controller, an integral controller, a proportional-integral controller, or a proportional-integral-derivative controller.

11. The device of claim 1, wherein the device is configured to set the correlation target value based on simulations or measurements.

12. The device of claim 2, wherein the linear controller circuit is configured to control the multiplier to adjust the modified random sequence by performing linear operations on the difference between the correlation and the correlation target value.

13. A method comprising:
   correlating a phase difference in a phase-locked loop with a random sequence to form a correlation;
   filtering the correlation;
   determining a gain correction factor based on the filtered correlation by a linear controller; and
   controlling a controllable oscillator based on the gain correction factor and the phase difference.

14. The method of claim 13, wherein filtering the correlation comprises low pass filtering the correlation.

15. The method of claim 13, wherein controlling the controllable oscillator comprises controlling a digitally controlled oscillator.

16. The method of claim 13, wherein controlling the controllable oscillator comprises:
   adding the gain correction factor to a signal based on the phase difference to form an added signal, and
   controlling the controllable oscillator with the added signal.

17. A device comprising:
   a digital phase-locked loop comprising:
      a digital phase detector;
      a digital loop filter, wherein an input of the digital loop filter is coupled to an output of the digital phase detector and the output of the digital loop filter is coupled to a first input of an adder;
      a digitally controlled oscillator, wherein the control input of the digitally controlled oscillator is coupled to an output of the adder, and wherein an output of the digitally controlled oscillator is coupled to an input of the phase detector;
   a random sequence generator circuit;
   a multiplier, wherein a first input of the multiplier is coupled to an output of the random sequence generator and wherein a second input of the multiplier is coupled to an output of the phase detector;
   a low pass filter, wherein an input of the low pass filter is coupled to an output of the multipliers;
   a linear controller, wherein an input of the linear controller is coupled to an output of the low pass filter, and wherein an output of the linear controller determines a correction factor; and
   a further multiplier coupled to an output of the random sequence generator circuit and configured to multiply an output of the random sequence generator circuit with the correction factor, wherein an output of the further multiplier is coupled to a second input of the adder.

18. The device of claim 17, further comprising a subtractor,
   wherein a first input of the subtractor is coupled to an output of the low pass filter,
   wherein a second input of the subtractor receives a correlation target value, and
   wherein an output of the subtractor is coupled to the input of the linear controller.

19. The device of claim 17, wherein the low pass filter is an infinite impulse filter.

20. A device comprising:
   a phase-locked loop comprising a phase detector, a loop filter coupled to an output of the phase detector and a controllable oscillator, a control input of the controllable oscillator being coupled to an output of the loop filter;
   a random sequence generation circuit configured to generate a random sequence;
   a correlation circuit comprising:
      a multiplier configured to multiply the random sequence with an output signal of the phase detector to generate a multiplied signal; and
      a low pass filter to filter the multiplied signal to generate a correlation between the random sequence and the output signal of the phase detector; and
   a linear controller circuit configured to generate a correction factor for the random sequence based on the correlation, wherein the device is configured to modify a signal at the control input of the controllable oscillator based on the random sequence modified based on the correction factor.

* * * * *